US008832612B1

United States Patent
O'Riordan et al.

(10) Patent No.: US 8,832,612 B1
(45) Date of Patent: Sep. 9, 2014

(54) NETLISTING ANALOG/MIXED-SIGNAL SCHEMATICS TO VAMS

(71) Applicant: Cadence Design Systems, Inc., San Jose, CA (US)

(72) Inventors: Donald J. O'Riordan, Sunnyvale, CA (US); Prabal Kanti Bhattacharya, Cupertino, CA (US); Timothy Martin O'Leary, Cupertino, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 14/073,634

(22) Filed: Nov. 6, 2013

Related U.S. Application Data

(62) Division of application No. 13/300,388, filed on Nov. 18, 2011, now Pat. No. 8,601,412.

(51) Int. Cl.
*G06F 17/50* (2006.01)

(52) U.S. Cl.
USPC ............ 716/103; 716/101; 716/102; 716/104

(58) Field of Classification Search
CPC .... G06F 17/5045; G06F 17/505; G06F 17/50
USPC .................................................. 716/101–104
See application file for complete search history.

(56) References Cited

U.S. PATENT DOCUMENTS

| | | | |
|---|---|---|---|
| 7,917,877 | B2 | 3/2011 | Singh et al. |
| 8,117,576 | B2 | 2/2012 | Mossawir et al. |
| 8,255,845 | B2 | 8/2012 | Ginetti |
| 2004/0172609 | A1 | 9/2004 | Hassibi et al. |
| 2008/0282212 | A1 | 11/2008 | Dennison et al. |
| 2009/0282379 | A1 | 11/2009 | Singh et al. |
| 2010/0095262 | A1 | 4/2010 | Garg et al. |
| 2011/0161899 | A1 | 6/2011 | Ginetti et al. |
| 2012/0210286 | A1 | 8/2012 | Abdelhamid |
| 2012/0233576 | A1 | 9/2012 | Barrows et al. |
| 2013/0047133 | A1 | 2/2013 | Alam et al. |

*Primary Examiner* — Stacy Whitmore
(74) *Attorney, Agent, or Firm* — Kenyon & Kenyon LLP

(57) ABSTRACT

A method is provided to convert an analog mixed-signal schematic design to a digital netlist: digital blocks within the schematic design are converted to digital netlist modules; analog blocks within the schematic design are converted to analog netlist modules: at least one digital netlist module includes a first identifier for a component that is shared between at least one digital block and at least one analog block within the schematic design; an analog netlist module that corresponds to the at least one analog block within the design includes a second identifier for the shared component that is different from the first identifier; the analog netlist modules are converted to corresponding digital netlist modules; the first identifier is substituted for the second identifier in the course of translating the analog netlist module that corresponds to the at least one analog block.

5 Claims, 13 Drawing Sheets

DIGITAL NETLIST

'include "disciplines.vams"
    // Library - testLib, Cell - top, View - schematic
    'timescale 1ns / 1ns module top (out, in);
        output out
        input in;
        buf IO (out, \3m_rg_1M|d);
    endmodule

FIG. 9B

DIGITAL MAP FILE netMaptop 3m_rg_1M|D \3m_rg_1M|d
    netMap top gnd! cds_globals.\gnd!
    netMap top vdd! cds_globals.\gnd!
    instMaster top IO sample_buf_symbol
    instMaster top M1 analogLib_nmos4_spectre
    instMaster top M0 analogLib_pmos4_spectre
    instMaster top R0 analogLib_res_spectre
    instMaster top V0 analogLib_vpulse_spectre
    instMaster top V1 analogLib_vdc_spectre
    cellMap top top testLib schematic
    topMap top

FIG. 9C

ANALOG NETLIST

// Design library name: testLib
    // Design cell name: top
    // Design view name: config_oss
    simulator lang=spectre
    global 0 vdd!
    parameters trise=1n Vsup=1.8 tperiod=10n Tdel=1n Trise=1n Tfall=1n Twidth=2n
    include "./models/mos.m"
    M1 (\3m_rg_1M|d in 0 0) d25N
    M0 (\3m_rg_1M|d in vdd! vdd!) d25P
    R0 (in net12) resistor r=100
    V0 (net12 0) vsource dc=0 type=pulse val0=0 val1=Vsup rise=trise
    V1 (vdd! 0) vsource dc=Vsup type=dc

FIG. 9D

ANALOG MAP FILE
    cellMap top top null null
    topMap top
    netMap top 3m_rg_1M|d \3m_rg_1M\ |d
    netMap top gnd! 0
    instMaster top I0 sample_buf_symbol
    instMaster top M1 analogLib_nmos4_spectre
    instMaster top M0 analogLib_pmos4_spectre
    instMaster top R0 analogLib_res_spectre
    instMaster top V0 analogLib_vpulse_spectre
    instMaster top V1 analogLib_vdc_spectre

FIG. 9E

FINAL NETLIST
    'include "disciplines.vams"
    // Library - testLib, Cell - top, View - schematic module top (out, in);
        output out
        input in;

buf I0 (out, \3m_rg_1M|d);
        d25N M1 (\3m_rg_1M|d , in, cds_globals.\gnd! , cds_globals.\gnd! );
        d25P M0 (\3m_rg_1M|d , in, cds_globals.\vdd! , cds_globals.\vdd! );
        resistor #(.r(100)) R0 (in, net12);
        vsource #(.dc(0), .type("pulse"), .val0(0), .val1(Vsup), .rise(trise))
            V0 (net12, cds_globals.\gnd! );
        vsource #(.dc(Vsup), .type("dc"))
            V1 (cds_globals.\vdd! , cds_globals.\gnd! );

endmodule

FIG. 9F

FINAL MAPPING TABLE
    cellMap top top testLib shematic
    instMaster top I0 sample_buf_symbol
    instMaster top M0 analogLib_pmos4_spectre
    instMaster top M1 analogLib_nmos4_spectre
    instMaster top R0 analogLib_res_spectre
    instMaster top V0 analogLib_vpulse_spectre
    instMaster top V1 analogLib_vdc_spectre
    netMap top 3m_rg_1M|d \3m_rg_1M|d
    netMap top gnd! cds_globals.\gnd!
    netMap top vdd! cds_globals.\vdd!
    topMap top

FIG. 9G

NETLISTING ANALOG/MIXED-SIGNAL SCHEMATICS TO VAMS

CROSS-REFERENCE TO RELATED APPLICATIONS

The present application is a divisional of and claims the benefit of U.S. application Ser. No. 13/300,388, filed Nov. 18, 2011, entitled "NETLISTING ANALOG/MIXED-SIGNAL SCHEMATIC TO VAMS." The disclosure of this application is incorporated herein by reference in its entirety.

BACKGROUND

FIG. 1 is an illustrative drawing representing a mixed signal schematic design hierarchy 100 used during capture and display of an integrated circuit (IC) design and a corresponding netlist module hierarchy 101 used for input to an IC simulation tool. The example schematic design hierarchy and the example netlist hierarchy are encoded in a computer readable storage device. A visual representation of the design hierarchy may be produced on a computer display screen. The netlist hierarchy 101 conveys connectivity information among instances and nets within the design hierarchy and is suitable as input to a circuit simulation tool.

A circuit designer or design team uses graphical program design tools to create a schematic circuit design hierarchy, which provides a graphical visual representation of circuit behavior in terms of circuit components and their connections. Analog components typically are represented graphically within the schematic design 100. Digital components often are represented with text blocks using a hardware description language (HDL) such as VHDL, Verilog or Verilog-AMS (hereinafter 'VAMS'), for example.

A top 'view' (or 'scope') 102 within the schematic design 100 may contain analog blocks, digital blocks or a mix of analog and digital blocks. FIG. 2 is an illustrative schematic diagram showing example details of view 102 of FIG. 1 that includes a digital block 202, an analog block 204 and a net 206 that interconnects the two blocks. The digital block 202 includes a digital gate 208. The analog block 204 includes analog components, a capacitor 210 and an inductor 212. The net 206 is shared between the two blocks 202, 204.

In a hierarchical design, schematic representations of components at a more abstract higher level of a design hierarchy instantiate design blocks lower in the hierarchy. Referring again to FIG. 1, blocks 202 and 204 within view 102 instantiate design blocks 104 and 106. Design block 104 instantiates design blocks 108 and 110. Design block 106 instantiates design block 112. As a result, design blocks disposed higher up in more abstract levels of the design hierarchy hide design details within corresponding design blocks disposed at lower less abstract levels of the hierarchy. In a cell-based IC design, repetitive blocks of circuitry are represented by cells that may be accessed from a design cell library. Cells disposed higher in an IC design hierarchy may contain instances of other cells lower in the hierarchy. Schematic design cells disposed higher in a design hierarchy hide from the user much of the detail and complexity of design cells lower in the hierarchy.

In order to test a design, the schematic design hierarchy is converted to the netlist hierarchy 101, which serves as input to a simulation tool used to simulate behavior of a circuit implemented according to the design. The netlist hierarchy 101 includes a plurality of text modules that correspond to views within the design hierarchy 100. The modules of the netlist include HDL text representations of the corresponding blocks of the design hierarchy that are suitable for use with a simulation tool used to simulate behavior of the circuit represented by the design hierarchy. Netlist module 122 corresponds to design view 102. Netlist module 202' corresponds to design block 202 and instantiates netlist module 124, which correspond to design blocks 104. Netlist module 204' corresponds to design block 204 and instantiates netlist module 126, which corresponds to design block 106. Netlist module 124 instantiates netlist modules 128 and 130, which correspond to design blocks 108 and 110, respectively. Netlist module 126 instantiates netlist module 132, which corresponds to design blocks 112.

The modules of a mixed signal netlist hierarchy typically consist of text in a digital HDL, such as VAMS, that is suitable for representation of digital design information. Accordingly, graphical representations of analog components of a mixed signal design hierarchy ordinarily are converted to a digital HDL text representation within the netlist hierarchy. The conversion from design schematic to netlist must account for components within the schematic design which are shared between analog and digital partitions. In addition, a schematic design block that represents an analog component may be annotated with one or more text statements that provide auxiliary model information, sometimes referred to a CDF (component description format) information, such as library information or instructions for the simulator, for example. These annotations may reference information, sometimes included as PDKs (process design kits), which is supplied by a foundry that is to manufacture the circuit, for example. The translation of a mixed signal design hierarchy to a netlist hierarchy also must account for these annotations.

FIG. 3 is an illustrative drawing of a system to convert an AMS (analog-digital mixed signal) schematic design used in design capture to a digital HDL netlist used in design simulation in accordance with certain prior art. A schematic representation of a circuit design encoded in computer readable storage device 302 can be displayed graphically on a computer display screen (not shown). A computer system is configured to implement a netlister 306.

The netlister 306 is configured to receive as input schematic design information, reference library information and PDK/CDF information encoded in storage devices 304, 308 and 310. The netlister 306 translates the schematic design 302 to a netlist in a digital design text language such as VAMS, which is encoded in storage device 312. A simulation environment 314 produces analog control statements that are stored in computer readable storage device 316. Digital models expressed in HDL language are stored in storage device 318. A simulator 320 configures a computer system to receive as input the netlist, the analog control statements and the digital models and to use these inputs to run a simulation of the circuit design 302.

The simulation environment 314 is produced by configuring a computer system to implement a module (not separately shown) that acts as a manager for the task of performing a simulation. The simulation environment 314 also may implement sub-tasks such as invoking a netlister to create a netlist, assembling and any user-supplied simulation options (such as the time interval over which the simulator is supposed to find a solution (this is an example of an analog control statement, the specification of that particular time interval), or the list of nodes whose waveforms need to be saved to disk by the simulator in order for subsequent viewing in a waveform tool, etc.) The environment also may manage post processing tasks such as waveform inspection, or measurements (e.g. measure a delay time from one signal transition to another) calculated from the simulation results.

In the past, translation of a mixed signal schematic design to a netlist suitable for utilization by a circuit simulation tool has been complicated by insufficient CDF information in many commercially available PDKs. A CDF typically describes the parameters and the attributes of parameters of individual components and libraries of components in a design. While PDK's typically have more complete information (well tested and proven) to enable netlisting to analog netlisting languages such as the SPICE and Spectre, they often have been incomplete or insufficiently tested to fully enable netlisting to the digital netlisting languages such as the VAMS.

FIG. 4 is an illustrative drawing of a netlister 400 to translate a design schematic to VAMS netlist in accordance with certain prior art. A computer system is configured to implement the netlister 400, which includes a netlister module 403 that includes a digital (e.g., Verilog) netlister 402 and an analog (e.g., Spectre) netlister 404, which interact to produce a hybrid netlist. A translator 406 translates the hybrid netlist to a VAMS netlist that is suitable for use in simulation. In operation, the Verilog netlister 404 receives as input schematic design information and reference library information contained in storage devices 410, 412 and traverses the design to produce VAMS language modules. The analog netlister 404 is invoked and receives PDK/CDF information contained in storage devices 414, which it uses to produce an analog design language modules such as SPICE or Spectre modules corresponding to analog instance objects within the design. A map file 418 is produced that maps object names from the analog language namespace to the VAMS namespace, which is the desired end namespace used during simulation. In the illustrative example, Spectre instance statements are wrapped within special tags (e.g., '_ANALOG_BEGIN', '_ANALOG_ END') to denote their presence, and the resulting hybrid netlist containsVerilog_AMS instance statements and wrapped Spectre instance statements. The translator 408 acts as a post-processor to search for the specially tagged hybrid statements (wrapped Spectre syntax instance statements using the VAMS namespace) and to translate those statements from the Spectre syntax to VAMS syntax and to replace the hybrid statements with the translated VAMS syntax.

Unfortunately, there have been shortcomings with this prior approach. For example, the example (prior translator 408 processed the tagged analog language statements with incomplete knowledge of surrounding context such as other VAMS statements. More specifically, for example, the translator 408 generally was unaware of sharing of items (such as a net) within a design between a digital component represented with the VAMS language in the hybrid netlist and an analog component represented with the analog language in the hybrid netlist. The analog (e.g., SPICE or Spectre) and digital (e.g., VAMS) languages have different rules for identifying items within a design. As a consequence, a shared item may be identified differently in the digital language and in the analog language. Name clashes sometimes occurred since the translator 408 operated with incomplete knowledge of surrounding Verilog_AMS statements. For example, the translator 408 sometimes would attempt to use the different names for the same item when mapping from Spectre namespace to the VAMS namespace.

Also, for example, the example prior translator 408 performed a line-by-line processing of the tagged statements of the hybrid netlist 416 and relied upon on a simple regular-expression based approach to parsing, which was frequently foiled in the presence of Spectre custom netlisting procedure extensions in a customer's design flow. For example, these custom netlist procedure extensions often reformat the netlist lines, sometimes adding or removing information, renaming objects.

Moreover, the example prior translator 408 failed to update the map file 418 creating difficulty in mapping simulation results to the source schematic design.

BRIEF DESCRIPTION OF THE DRAWINGS

FIG. 9B is an illustrative drawing showing an example digital netlist produced from the schematic cell view of FIG. 94 using the digital netlister of FIG. 54.

FIG. 9C is an illustrative drawing showing an example digital map file produced for the digital netlist of FIG. 9B.

FIG. 9D is an illustrative drawing showing an example analog netlist produced from the schematic cell view of FIG. 94 using the analog netlister of FIG. 54.

FIG. 9E is an illustrative drawing showing an example analog map file produced for the analog netlist of FIG. 9D.

FIG. 9F is an illustrative example combined netlist produced from the digital netlist of FIG. 9B and the analog netlist of FIG. 9D.

FIG. 9G is an illustrative example combined mapping produced for the example digital map file of FIG. 9C and the example analog map file of FIG. 9E.

SUMMARY

In one aspect, a method, article of manufacture and system are provided to convert an analog mixed-signal schematic design to a digital netlist. Digital blocks within the schematic design are converted to digital netlist modules. Analog blocks within the schematic design are converted to analog netlist modules. At least one digital netlist module includes a first identifier for a component that is shared between at least one digital block and at least one analog block within the schematic design. An analog netlist module that corresponds to the at least one analog block within the design includes a second identifier for the shared component that is different from the first identifier. The analog netlist modules are converted to corresponding digital netlist modules. In the course of converting the analog netlist modules to digital netlist modules, the first identifier is substituted for the second identifier.

These and other features and advantages will become apparent for the following description of embodiments in conjunction with the appended drawings.

DESCRIPTION OF THE EMBODIMENTS

Figure 1:
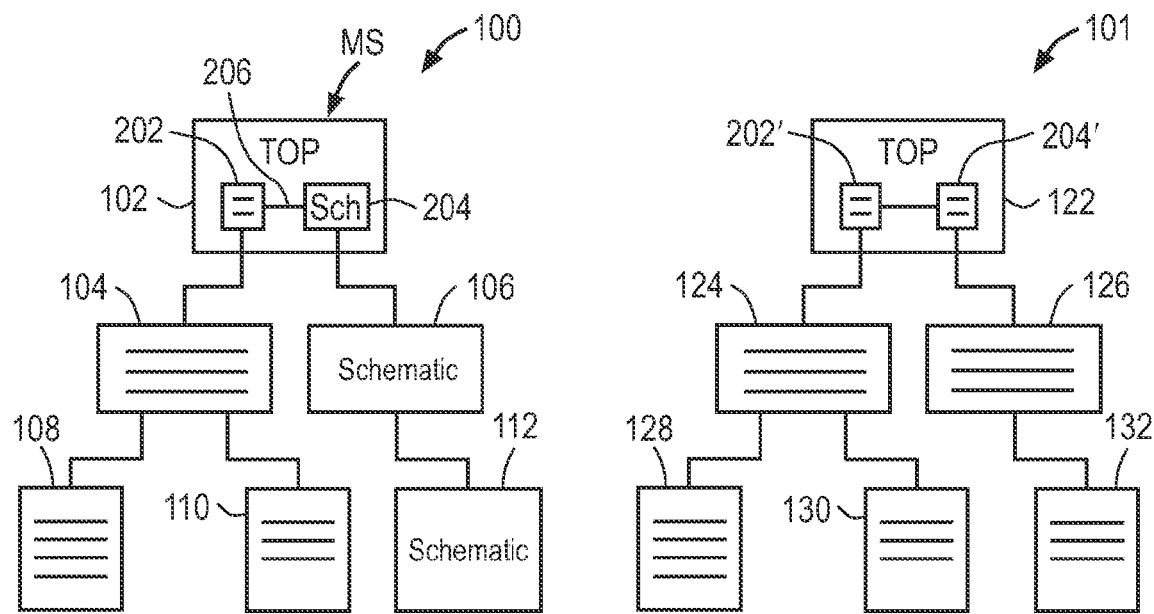
FIG. 1 is an illustrative drawing representing a mixed signal schematic design hierarchy used during capture and display of an integrated circuit (IC) design and a corresponding netlist module hierarchy used for input to an IC simulation tool.
Figure 2:
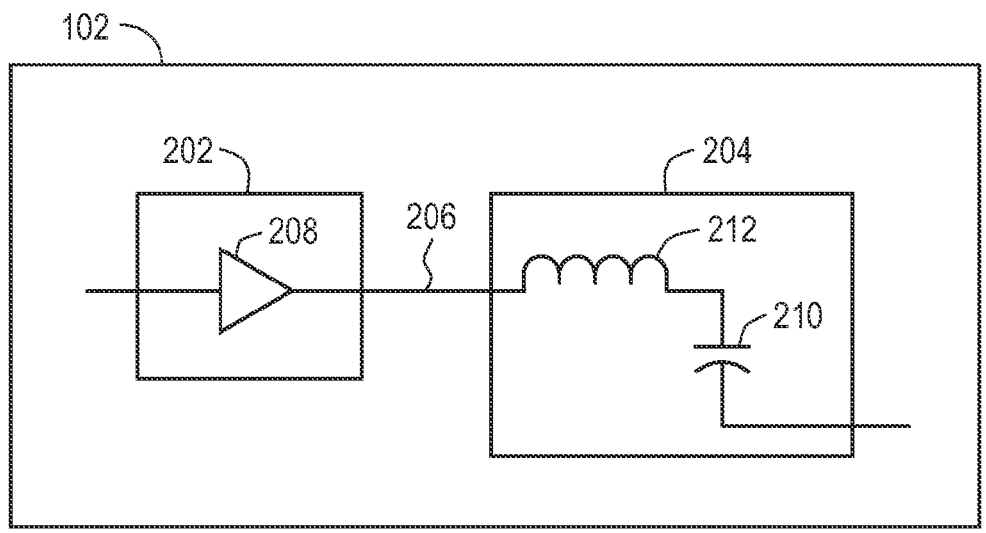
FIG. 2 is an illustrative schematic diagram showing example details of view of FIG. 1 that includes a digital block, an analog block and a net that interconnects the two blocks.
Figure 3:
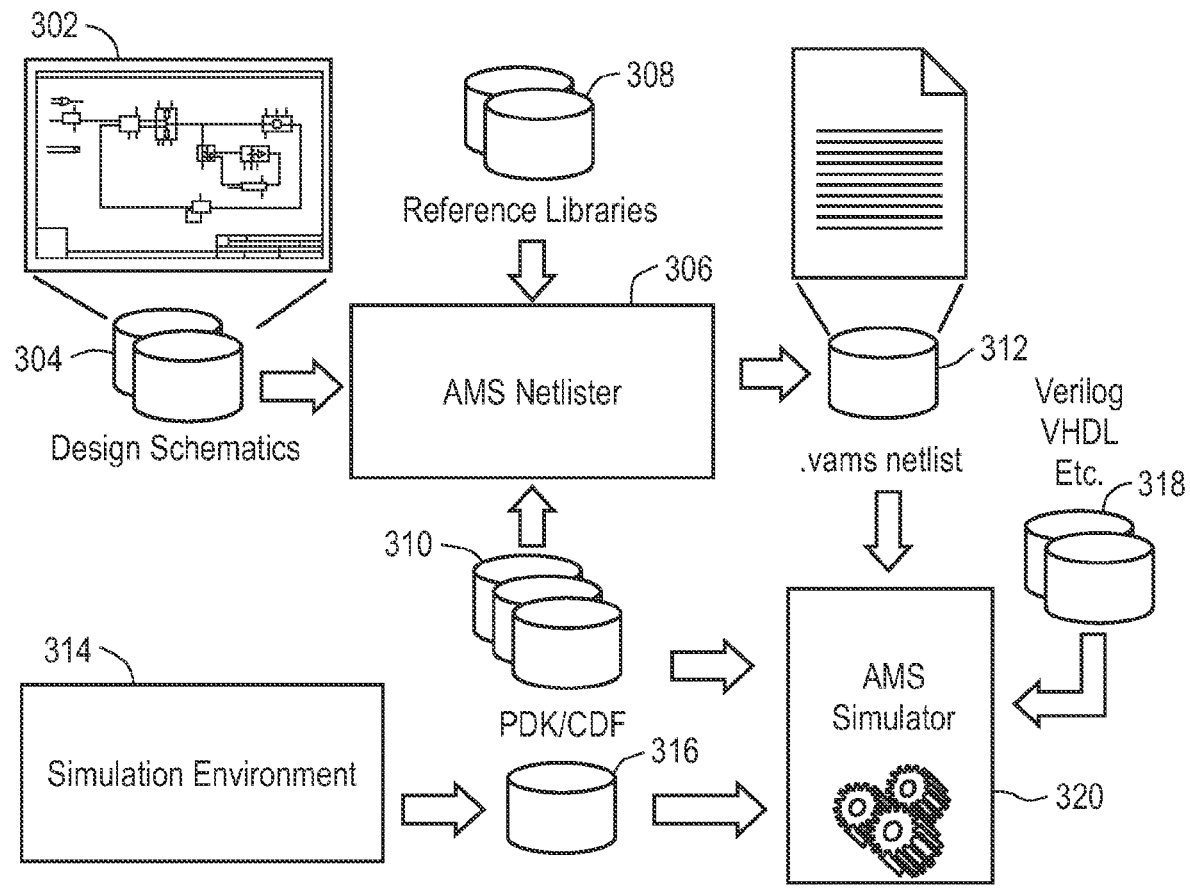
FIG. 3 is an illustrative drawing of a system to convert an AMS (analog-digital mixed signal) schematic design used in design capture to a digital HDL netlist used in design simulation in accordance with certain prior art.
Figure 4:
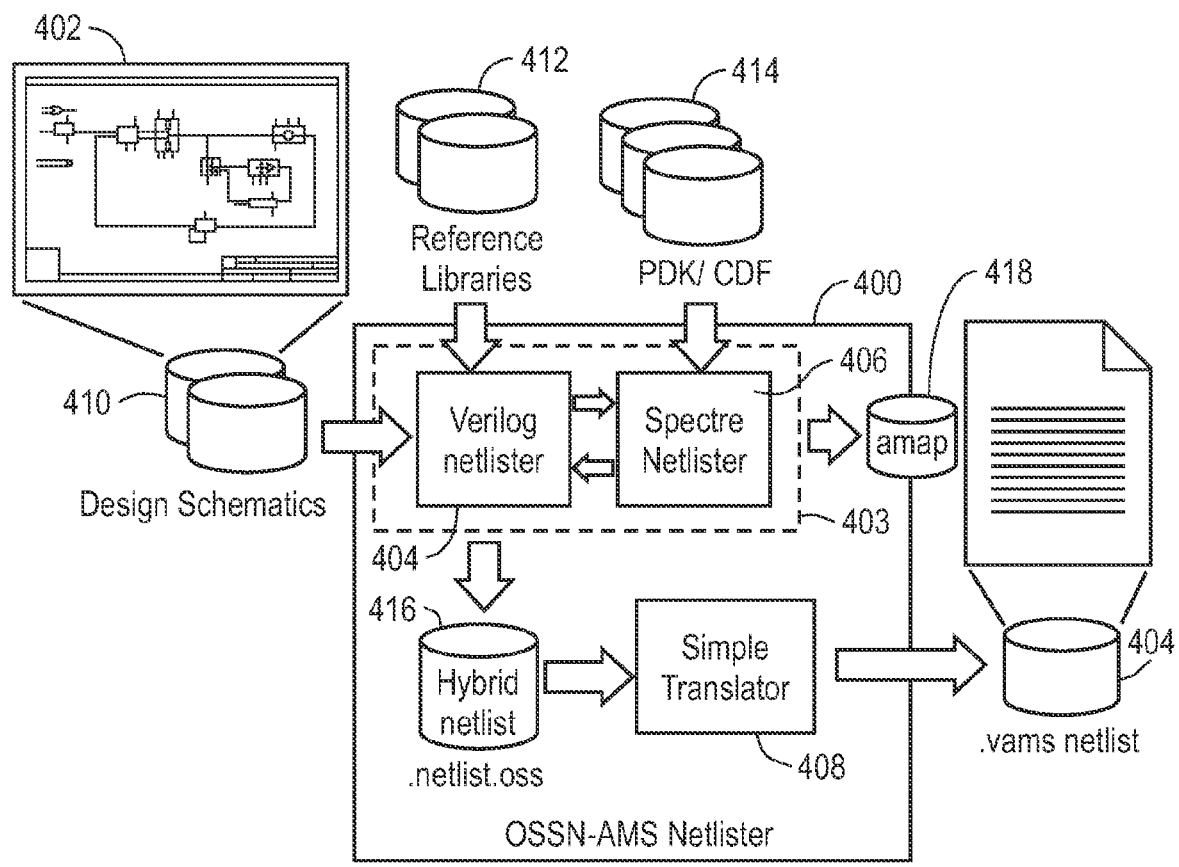
FIG. 4 is an illustrative drawing of a netlister to translate a design schematic to a VAMS netlist in accordance with certain prior art.
Figure 5A:
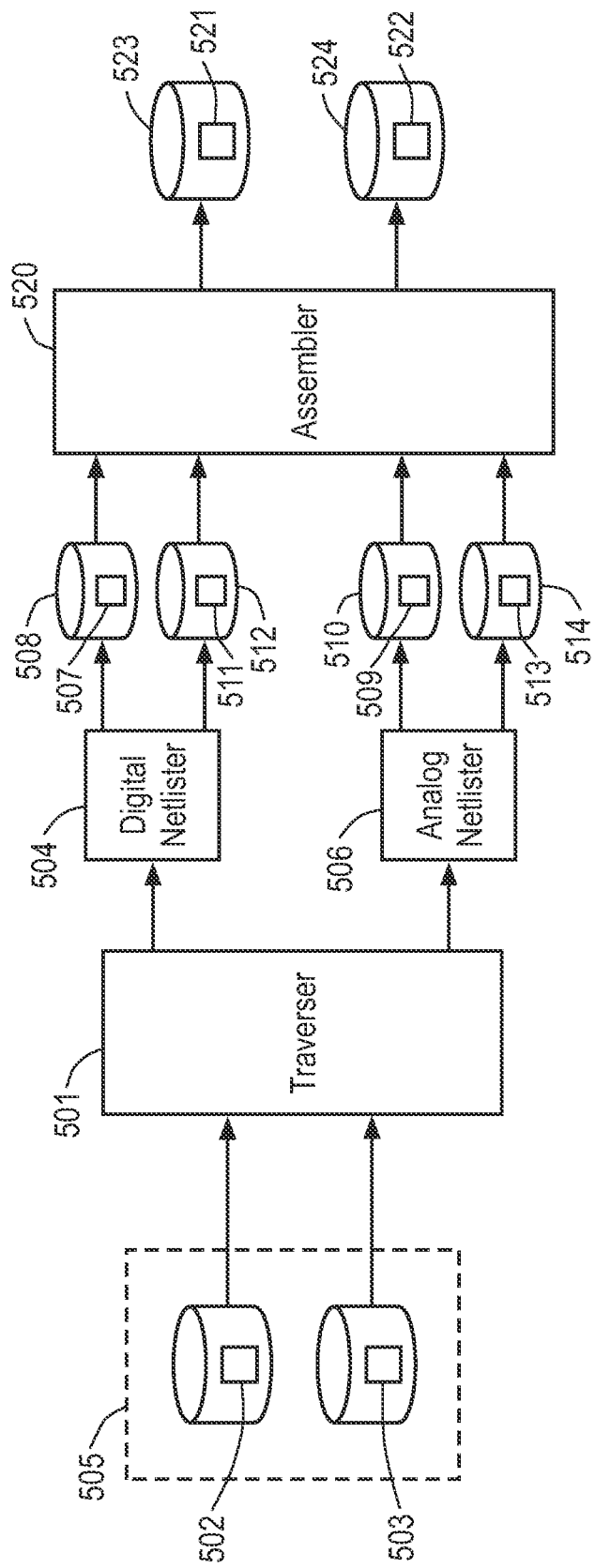
FIG. 5A is an illustrative structural flow diagram showing both operations and components used by a system to convert an analog mixed-signal schematic design to a netlist text language suitable to represent an analog mixed-signal design in accordance with some embodiments.

The following description is presented to enable any person skilled in the art to create and use a computer system configuration and related method and article of manufacture to convert a schematic circuit design to a netlist representation suitable for simulation. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. For example, even though the embodiments of the present invention are merely illustrated and explained in the context of the Spectre language and simulator, one of ordinary skill in the art will recognize that the present invention can be readily applied in SPICE or other SPICE-based language, such as SPICE from U.C. Berkeley, CDL (Cell Description Language), AFS (Analog Fast SPICE from Berkeley Design Automation), and SmartSPICE from Silvaco, and their corresponding simulators. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein, FIG. 5A is an illustrative structural flow diagram showing both operations and components used by a system 500 to convert an analog mixed-signal schematic design to a netlist text language suitable to represent a digital design in accordance with some embodiments. A computer system is configured to implement the modules of the system 500. The system 500 includes a traversal module 501 to traverse the schematic design 502, a digital netlister 504 to produce a digital netlist 507 from digital portions of the design 502, an analog netlister 506 to produce an analog netlist 509 from analog portions of the design 502. A netlist assembler 520 combines the two netlists to produce a combined netlist 521.

A computer system is configured with computer program code to implement the digital netlister 504, which translates 'digital' portions of the schematic design 505 to a netlist language suitable for consumption by a 'digital' circuit simulator such as Verilog-XL or Verilog AMS, for example. The digital portions of the design consist of objects that the digital simulators (such Verilog, -XL or Verilog-AMS) understand, typically consisting of gate level objects such as NAND, NOR, etc and the connections between them. The digital netlist language is typically a HDL, such as Verilog or VHDL.

A computer system is configured with computer program code to implement the analog netlister 506, which translates the 'analog' portions of the schematic design 505 to a netlist language suitable for consumption by an 'analog' circuit simulator such as a SPICE-based simulator (e.g., Synopsys HSPICE, Mentor Graphics Eldo, or Magma Design Automation FineSim SPICE) or Spectre, for example. The analog portions of the design consist of objects that SPICE or Spectre simulators understand how to simulate, typically consisting of objects such as MOSFETs, resistors, capacitors, voltage and current sources, etc., and the connections between them. The netlist language is typically some derivative or dialect of the SPICE netlist language. The digital netlister 504 also operates to generate a digital netlister mapping 511 between identifiers used in the schematic design 502 and identifiers used in the digital netlist 507. Likewise, the analog netlister 506 operates to generate an analog netlister mapping 513 between identifiers used in the schematic design 502 and identifiers used in the analog netlist 509. The netlist assembler 520 also operates to combine the digital netlister mapping 511 and the analog netlister mapping 513 to produce a combined mapping 522 between identifiers used in the combined netlist 521 and identifiers used in the schematic design 502.

The traversal module 501 receives as input a schematic design 502 that may include annotations associated with analog components such as PDK/CDF, for example, and also receives reference library information 503 encoded in one or more storage devices 505. The traversal module traverses the design and invokes both a digital netlister module 504 and an analog netlister module 506. In some embodiments, the traversal module 501 implements a recursive algorithm that inspects component instances within the current level of hierarchy. For each such instance, it informs the netlister 504 and/or 506 of the existence of that instance, such that the netlister can output the appropriate netlist language translation. For each such instance, it also finds the corresponding cell master definition, and then repeats the process for all the instances defined within that cell. Due to this recursive nature, the traversal module thus visits every unique cell which is instantiated in the design hierarchy, ensuring that that cell is netlisted (translated to a textual form) in which all the instances within that cell are accounted for.

In some embodiments, the digital netlister 504 comprises a VAMS netlister, and the analog netlister 506 comprises an analog netlister using the Spectre language. As the traversal module 501 traverses the design, the digital netlister 504 produces a netlist in a digital language (e.g., VAMS). In particular, the digital netlister 504 identifies portions of the design that represent digital blocks and produces a digital netlist representation of those digital blocks. The digital netlister 504 ignores portions of the design that represent analog blocks. The digital netlister 504 stores the resulting digital netlist in a storage device 508. Similarly, the analog netlister 506 identifies portions of the design that represent analog blocks and produces an analog netlist representation of those analog1 blocks. The analog netlister 506 ignores portions of the design that represent digital blocks. The analog netlister 506 stores the resulting analog netlist in a storage device 510.

In the course of producing the digital netlist 507 encoded in storage device 508, the digital netlister 504 may change identifiers for one or more items associated with digital components, and as a result, the identifier used for an item in the schematic design 502 may be different from the identifier used for the same item in the digital netlist 507. The digital netlister 504 produces a digital netlister mapping file 511 (such as a table) encoded in a storage device 512 that provides a mapping between identifiers used for an item in the schematic design 502 and an identifier used for the same item in the digital netlist 507 encoded in storage device 508. The digital netlister mapping file 511 allows items in the digital netlist 507 to be traced back to items in the schematic design 502.

Similarly, in the course of producing the analog netlist 509 encoded in storage device 510, the analog netlister 506 may change identifiers for one or more items associated with analog components, and as a result, the identifier used for an item in the schematic design 502 may be different from the identifier used for the same item in the analog netlist 509. The analog netlister 506 produces an analog netlister mapping file 513 (such as a table) encoded in a storage device 514 that provides a mapping between identifiers used for an item in the schematic design 502 and an identifier used for the same item in the analog netlist 509 encoded in storage device 510. The analog netlister mapping file 513 allows items in the analog netlist 509 to be traced back to items in the schematic design 502.

The netlist assembler 520 receives as input the digital netlist 507, the analog netlist 509, the digital netlister mapping file 511 and the analog netlister mapping file 511. The netlist assembler 520 both translates the analog netlist 509 to digital netlist form so as to produced the combined netlist 521 and also produces the combined mapping 522. The netlist assembler 520 need not translate the digital netlist 507 since it already is in digital netlist form. The netlist assembler 520 incorporates into the combined mapping 522 mappings from the digital netlister mapping file 511 for items in those digital modules within the digital netlist 507 that do not share any items with modules (or subcircuits) of the analog netlist 509.

The netlist assembler 520 translates the analog netlist 509 to digital netlist form. It will be appreciated that many of the rules used within the analog netlist language (e.g., SPICE or Spectre) are different from and in conflict with rules used within the digital netlist language (e.g., VAMS). As a result, items that are shared within the schematic design 502 may end up being identified with different identifiers within the digital netlist 507 and the analog netlist 509. In other words, the digital netlister 504 may select a name for an item included in the digital netlist 507 that is different from the identifier selected by the analog netlister 506 to identify the same item in the analog netlist 509.

In the course of translating the analog netlist 509 to digital form, the netlist assembler 520 may perform translations that change identifiers used within the analog netlist 509 to comply with digital netlist language rules. The netlist assembler 520 operates to include within the combined mapping 522, mappings between these changed identifiers and corresponding items of the schematic design 502. Moreover, if an item in a given subcircuit of the analog netlist 509 also occurs in a module of the digital netlist 507, then the netlist assembler 520 operates to adopt the identifier used to identify the item in the digital netlist 507, and uses that same identifier in the digital translation that it produces for the given subcircuit the analog netlist 509.

Output of the netlist assembler 520 includes the combined netlist 521 encoded in computer readable storage device 523 and the combined mapping 522 encoded in computer readable storage device 524. The combined netlist 521 can be input to a simulator 320 to simulate behavior of the schematic design 502. The combined mapping 522 can be used to map between items in the combined netlist 521 and items in the original schematic design 502.

Figure 5B:
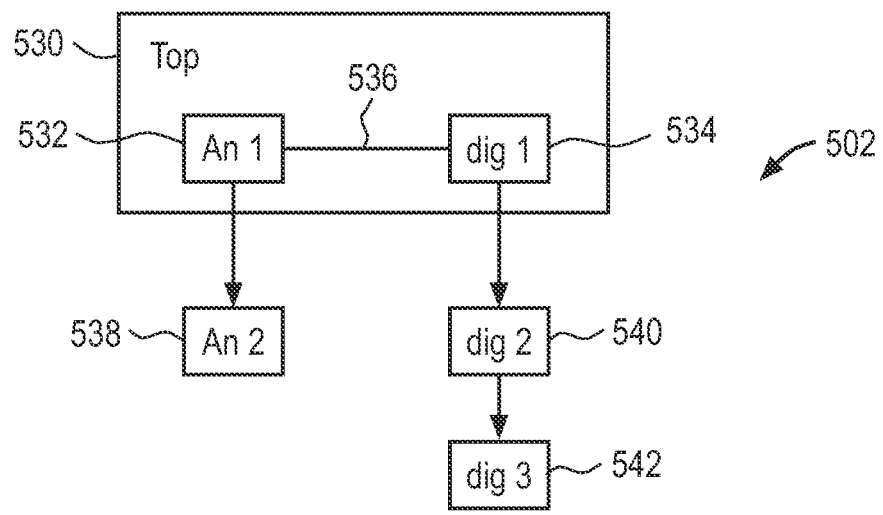
FIG. 5B is an illustrative drawing representing a mixed signal design hierarchy that is input to the system of FIG. 5A.

FIGS. 5B-5E are illustrative drawings showing transformations within portions of the system 500 of FIG. 5A in accordance with some embodiments. FIG. 5B is an illustrative drawing representing a mixed signal design hierarchy 502 that is input to the system 500 of FIG. 5A. The schematic design 502 includes an analog mixed-signal view 530 identified in the design as 'top' that includes a first analog design block 532, a first digital design block 534 and a shared component 536. The first analog block 532 instantiates a second analog design block 538. The first digital block 534 instantiates a second digital design block 540, which in turn, instantiates a third digital design block 542.

Figure 5C:
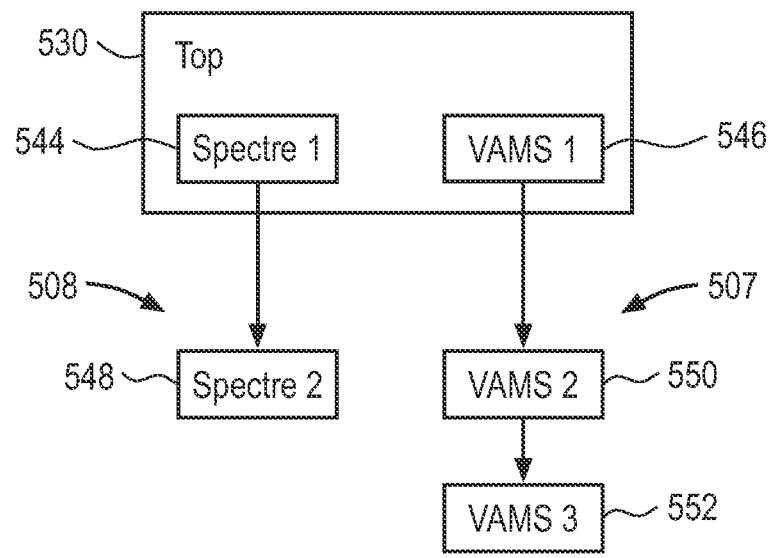
FIG. 5C is an illustrative drawing representing a digital netlist and an analog netlist produced by the digital netlister and the analog netlister of FIG. 5A in accordance with some embodiments.
Figure 5D:
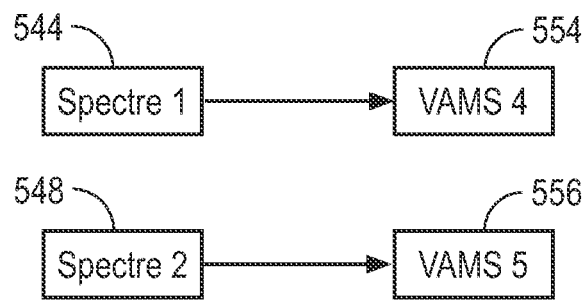
FIG. 5D is an illustrative drawing representing conversion of analog netlist modules to digital netlist modules by the assembler of FIG. 5A in accordance with some embodiments.

FIG. 5C is an illustrative drawing representing a digital netlist 507 and an analog netlist 509 produced by the digital netlister 504 and the analog netlister 506 of FIG. 5A in accordance with some embodiments. The digital netlist 507 includes a first VAMS (VAMS) module 546 that corresponds to the first digital design block 534, a second VAMS netlist module 550 that corresponds to the second digital design block 540 and a third VAMS netlist module 552 that corresponds to the third digital design block 542. The first VAMS netlist module 546 instantiates the second VAMS netlist module 550, which, in turn, instantiates the third VAMS netlist module 552. The analog netlist 509 includes a first Spectre netlist module (or subcircuit) 544 that corresponds to the first analog design block 532 and includes a second Spectre netlist module 548 that corresponds to the second analog design block 538. The first Spectre netlist module 544 instantiates a second Specture module 548. Note that the first Spectre netlist module 544 and the first VAMS netlist module 546 are associated with the 'top' view (or 'scope') 530, FIG. 5D is an illustrative drawing representing conversion of analog netlist modules to digital netlist modules by the assembler 520 of FIG. 5A in accordance with some embodiments. The assembler 520 converts the first Spectre netlist module 544 to a fourth VAMS netlist module 554. The assembler 520 converts the second Spectre netlist module 548 to a fourth VAMS netlist module 556.

Figure 5E:
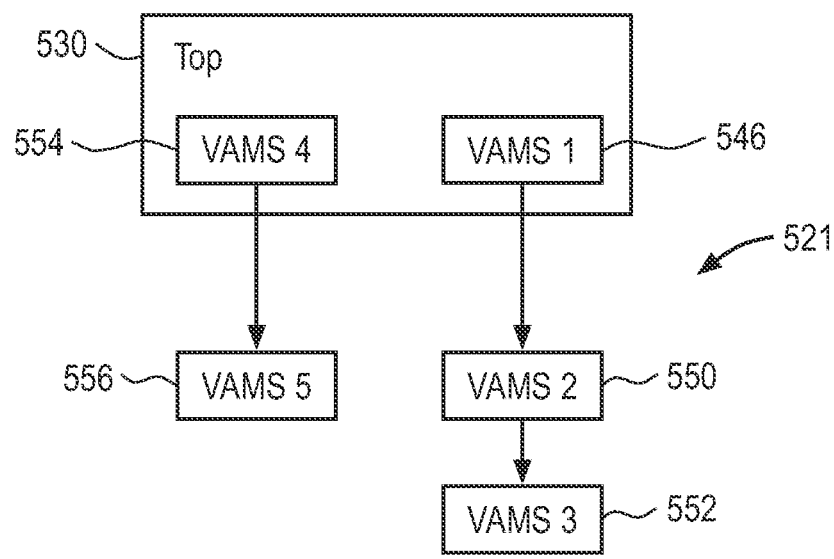
FIG. 5E is an illustrative drawing representing a combined netlist produced by the assembler of FIG. 5A in accordance with some embodiments.

FIG. 5E is an illustrative drawing representing a combined netlist 521 produced by the assembler 520 of FIG. 5A in accordance with some embodiments. The combined netlist 521 includes the first, second and third VAMS netlist modules 546, 550, 552, which are substantially unchanged from their form as produced by the digital netlister 504. The combined netlist 521 also includes the fourth and fifth VAMS netlist modules 554, 556, which are produced by translating the analog netlist modules produced by the analog netlister 506 to a digital netlist modules.

Figure 6:
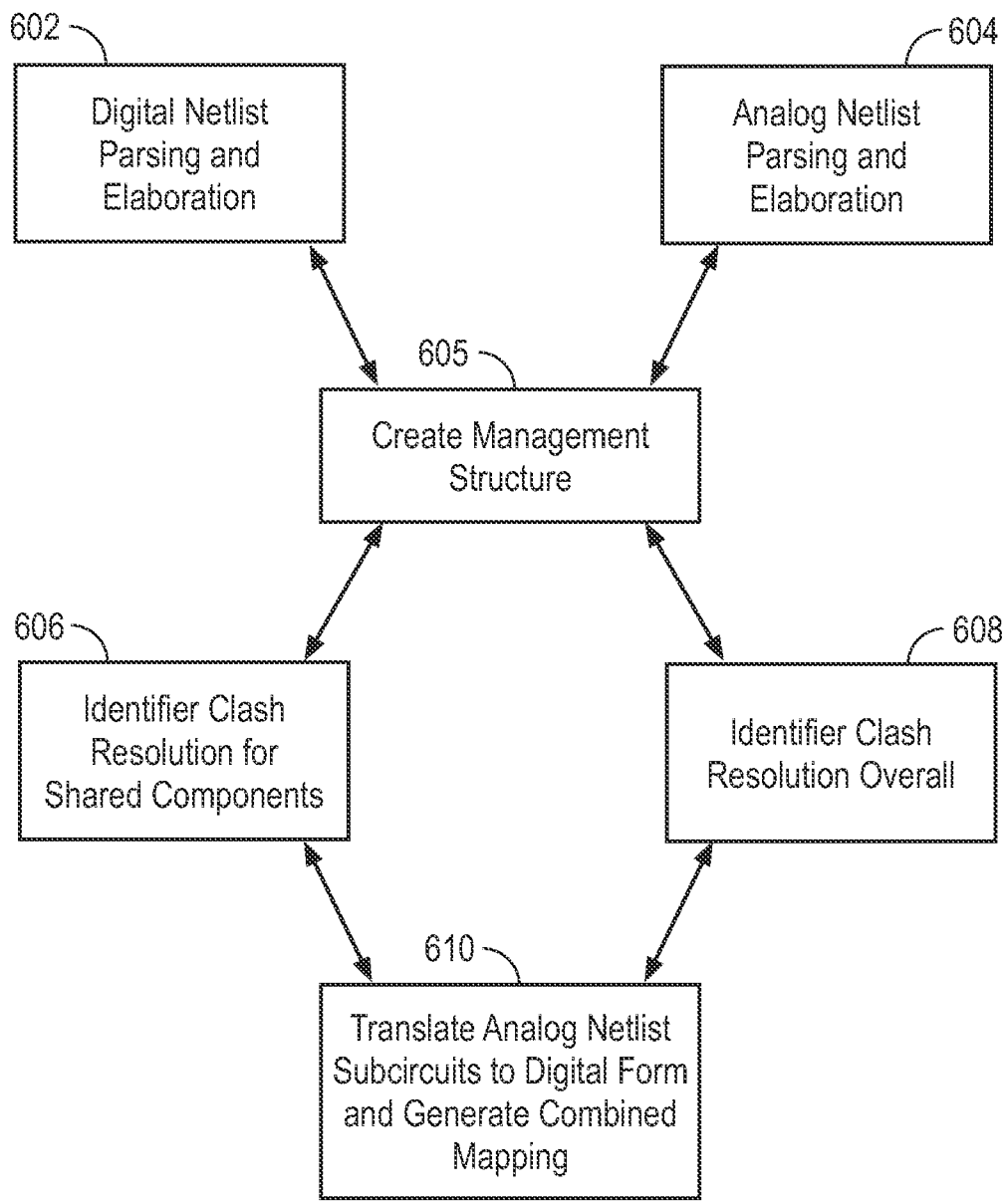
FIG. 6 is an illustrative flow diagram representing a process performed using assembler of FIG. 5A in accordance with some embodiments.

FIG. 6 is an illustrative flow diagram representing a process 600 performed using assembler 520 of FIG. 5A in accordance with some embodiments. A computer system is configured with computer program code to implement the modules shown within FIG. 6. Process module 602 parses and traverses the digital netlist 507 to identify modules and components within the digital netlist 507. Process module 604 parses and traverses the analog netlist 509 to identify modules and components within the analog netlist 509. Process module 605 creates a structure in a computer readable storage device to manage flow of information between the digital netlist 507 and the analog netlist 509 and between the digital netlister mapping 511 and the analog netlister mapping 513. In some embodiments, the management structure comprises a FIFO (not shown). Process module 606 resolves name clashes where a digital netlist module and an analog netlist subcircuit share a component. Process module 608 resolves name clashes between digital netlist modules and analog netlist subcircuits that do not necessarily share a component. Process module 610 translates analog netlist subcircuits to digital form to produce the combined netlist 521 and produces the combined mapping 522.

Figure 7:
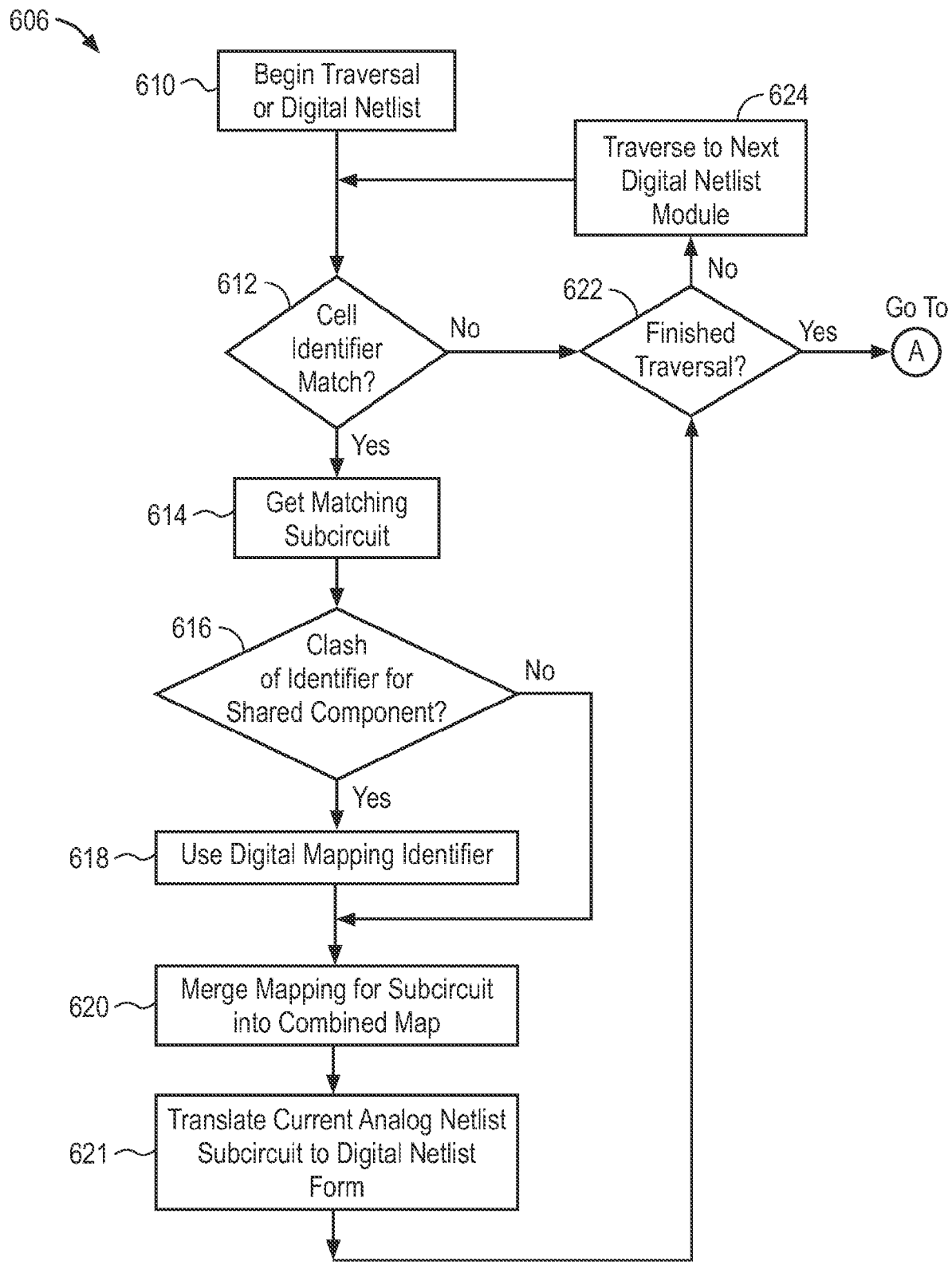
FIG. 7 is a flow diagram to represent acts involved with process module of FIG. 6 in accordance with some embodiments.

FIG. 7 is a flow diagram to represent acts involved with process module 606 of FIG. 6 in accordance with some embodiments. Process module 610 starts a traversal of digital netlist modules 546, 550 and 552 shown in FIG. 5C, for example. Decision module 612 determines whether there is an analog netlist module (e.g., 544 or 548) that is associated with a view or scope that has an identifier that matches that of a currently selected digital netlist module. If not, then decision module 622 determines whether the traversal is finished. If not, then module 624 selects a next digital netlist module in the traversal. If traversal is finished, then control flows to node "A" and to the flow diagram of FIG. 8. If decision module 616 determines that there is a name match, then module 614 selects the matching analog netlist module as a current analog module.

Process module 616 uses the digital and analog netlister mappings 511, 513 to determine whether there is clash between identifiers used in the current digital netlist module and an identifier used in the current analog netlist subcircuit. If an identifier clash is identified, then process module 618 causes the identifier used by the digital netlister mapping to be used in the combined mapping file 522. Process module 620 merges the remaining mappings corresponding to the current analog netlist module into the combined mapping file 522. It will be appreciated that the combined mapping file 522 is built up from the digital netlister mapping file 511 as information from the analog netlister mapping 513 is progressively added to it. Module 621 translates the current analog netlist subcircuit to a digital netlist module. Control then flows to decision module 622.

Figure 8:
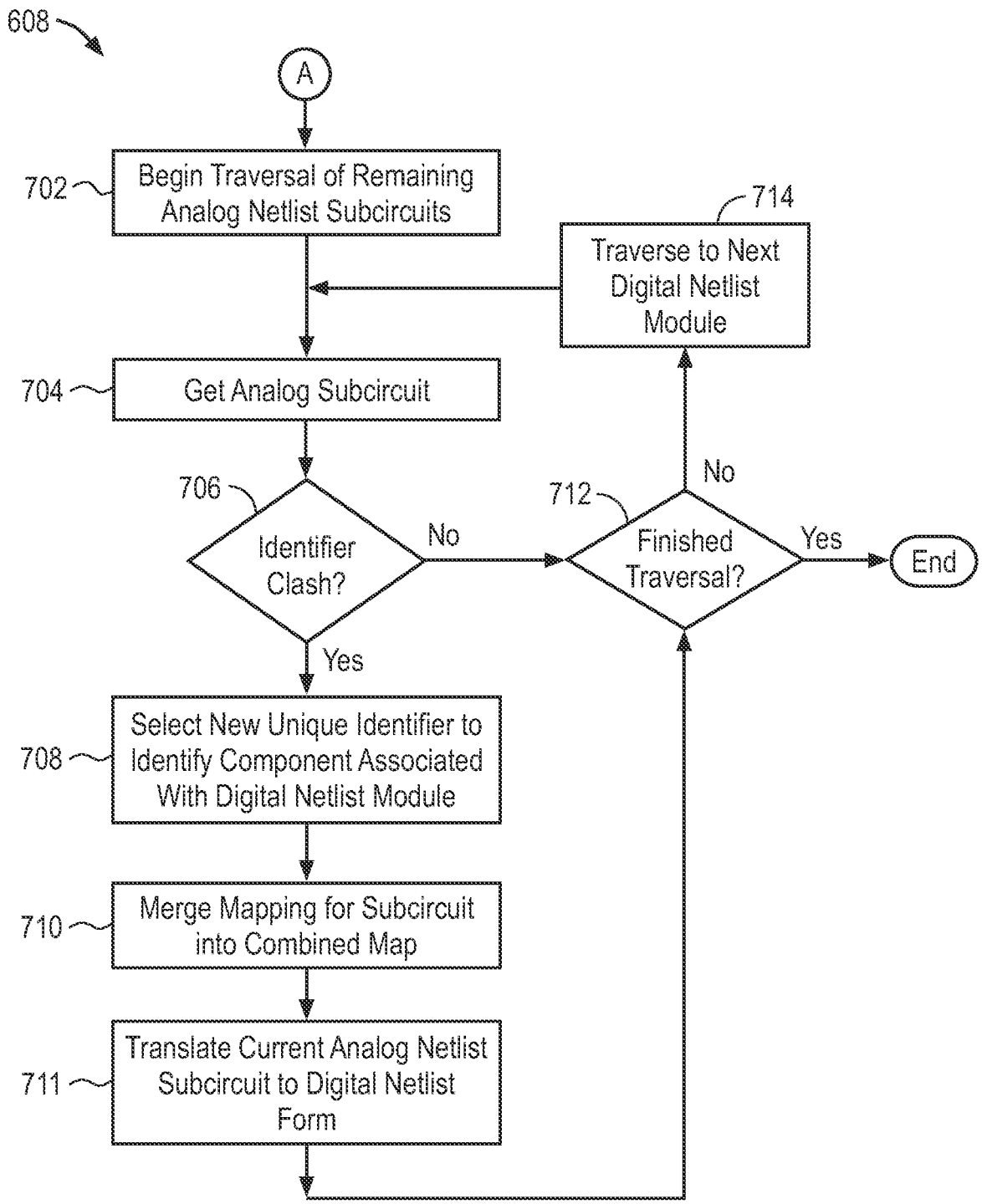
FIG. 8 is a flow diagram to represent to represent acts involved with process module of FIG. 6 in accordance with some embodiments.

FIG. 8 is a flow diagram to represent to represent acts involved with process module 608 of FIG. 6 in accordance with some embodiments. Process module 702 begins traversal of the remaining analog netlist modules that have not been processed by process module 606. Process module 704 selects a next analog netlist subcircuit. Process module 706 uses the digital and analog netlister mappings 511, 513 to determine whether there is clash between identifiers used in the current analog netlist subcircuit and an identifier used in any of the digital netlist modules. If an identifier clash is identified, then process module 708 changes the identifier used within the digital netlister mapping 511.

For example, assume that Table 1 represents an entry in the analog netlister mapping 513 for the current analog netlist subcircuit in the process module 608.

TABLE 1

| Schematic design item identifier | Analog subcircuit item identifier |
|---|---|
| L | M |

Further assume that Table 2 represents an entry in a digital netlister mapping 511 for some other digital netlist module.

TABLE 2

| Schematic design item identifier | Digital module item identifier |
|---|---|
| K | M |

In this example, decision module 706 would determine that an identifier clash exists since the current analog netlist subcircuit and another digital netlist module use the same identifier "M" to identify different items in the schematic design, "L" and "k" respectively. Thus, in this example, process module 708 would change the identifier used within the digital netlister mapping 511.

Now, continuing with the explanation of FIG. 8, process module 710 merges analog netlister mappings corresponding to the current analog netlist module into the combined mapping file 522. Process module 711 translates the current analog netlist subcircuit to a digital netlist module. Control then flows to decision module 712, which determines whether the traversal is finished. If not, then process module 714 selects a next analog netlist subcircuit in the traversal. If traversal is finished, then the process ends.

EXAMPLE

Figure 9A:
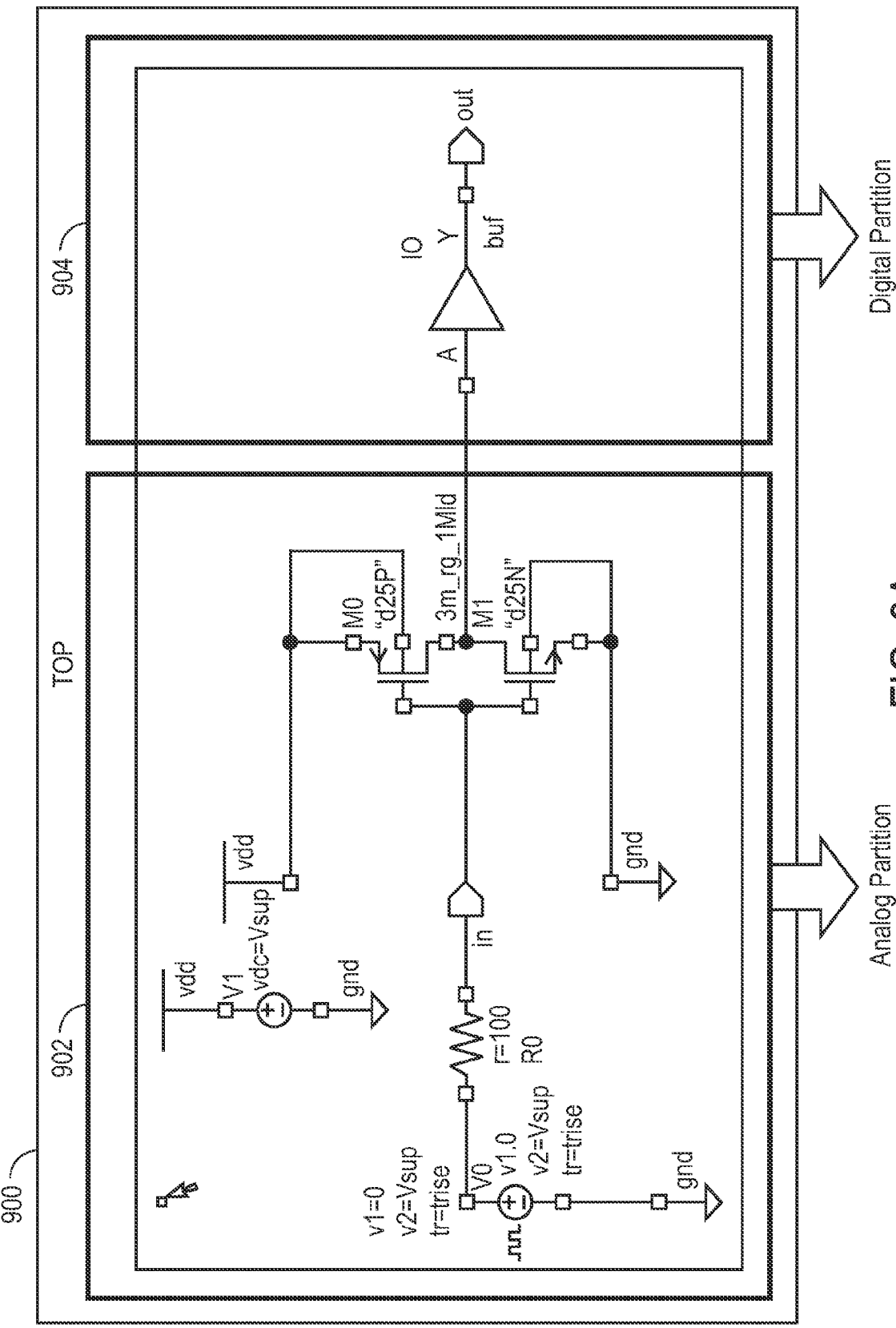
FIG. 9A is an illustrative schematic diagram of an example schematic cell view.

An example of the process of FIGS. 6-8 is explained with reference to the example represented by FIGS. 9A-9G. FIG. 9A is an illustrative schematic diagram of an example schematic cell view. FIG. 9B is an illustrative drawing showing an example digital netlist produced from the schematic cell view of FIG. 9A using the digital netlister 504 of FIG. 5A. FIG. 9C is an illustrative drawing showing an example digital map file produced for the digital netlist of FIG. 9B. FIG. 9D is an illustrative drawing showing an example analog netlist produced from the schematic cell view of FIG. 9A using the analog netlister 506 of FIG. 5A. FIG. 9E is an illustrative drawing showing an example analog map file produced for the analog netlist of FIG. 9D. FIG. 9F is an illustrative example combined netlist 521 produced from the digital netlist of FIG. 9B and the analog netlist of FIG. 9D. Although the analog simulation language Spectre is used for the analog netlist of FIG. 9D, other simulation languages based on SPICE may also be used as well as other software implementations for EDA (Electronic Design Automation). "FIG. 9G is an illustrative example combined mapping 522 produced for the example digital map file of FIG. 9C and the example analog map file of FIG. 9E.

In the following explanation, it will be appreciated that various details of circuit components and code listings FIGS. 9A-9G will be readily understood by persons of ordinary skill in the art. Moreover, many details of circuit components and code listings are unimportant to the description of the invention herein. Thus, the explanation focuses upon details that explain the illustrative process of FIGS. 6-8.

Referring to FIG. 9A, there is shown an illustrative drawing of a schematic cell view (or scope) 900 identified as "top" that includes an analog instance cell 902 and a digital instance cell 904 that are connected by a net named with a first identifier, "3m_rg__1M|d". The schematic cell view 900 has its own name space in this example, and the first identifier "3m_rg__1M|d" identifies the shared net in that namespace. Thus, the schematic cell view 900 comprises an analog mixed-signal design in which net "3m_rg__1M|d" is shared by the digital and analog instance cells 902, 904.

It will be appreciated that the schematic cell view 900 may be a part of the larger schematic design (not shown). Also, it will be understood that a cell library (not shown) may contain a plurality of different cells, which sometimes are referred to as blocks. Each cell may have a variety of different implementations, and different implementations of that cell are referred to as different 'views' of the cell. The cell view instances 902, 904 shown in FIG. 9A do not indicate how those instances are implemented. Rather, the example instances that are shown serve as convenient mechanisms to assemble blocks representing circuit behavior onto and relationships among these instances onto a schematic design.

In the course of translating schematic design 502 of FIG. 5A to a combined netlist 521, for example, assume that the traversal module 501 comes upon schematic cell view of FIG. 9A. In response, the traversal module 501 invokes the digital netlister 504, which produces the digital netlist of FIG. 9B in the VAMS language for the digital instance cell 904 and ignores the analog instance cell 902. Persons skilled in the art will understand that the first identifier "3m_rg__1M|d" is illegal in the Verilog_AMS language. Specifically, in VAMS, the use of numbers at the beginning of an identifier is illegal and the use of the pipe(|) symbol is illegal anywhere within an identifier, and the symbol "\" in front of the overall identifier and the use of a trailing space after the identifier is used to tell the compiler to 'escape' the illegal naming. Accordingly, the digital netlister 504 in this example renames the net with a second identifier "\3m_rg__1M|d" in the illustrative netlist of FIG. 9B.

Moreover, the digital netlister 504 also creates a first netlister mapping, which comprises a digital netlister mapping illustrated in FIG. 9C, a portion of which is represented in Table 3.

TABLE 3

| Type of item | scope | First identifier used in schematic | Second identifier used in VAMS |
|---|---|---|---|
| netMap | top | 3m_rg_1M|d | \3m_rg_1M|d |

Also in response to arriving at the schematic cell view of FIG. 9A, the traversal module 501 invokes the analog netlister 506, which produces the analog netlist of FIG. 9D in the Spectre language for the analog instance cell 902 and ignores the digital instance cell 904. Persons skilled in the art will understand that the first identifier "3m_rg__1M|d" is illegal in the Spectre language. Specifically, in Spectre, the use of numbers at the beginning of an identifier is illegal, and the use of the pipe(|) symbol is illegal anywhere within an identifier, and the symbol "\" in front of individual numbers within the identifier and the use of a trailing space after the overall identifier is used to instruct the compiler to 'escape' the illegal naming. Accordingly, the analog netlister 506 in this example renames the shared net as a third identifier "\3m_rg__1M\|d" in the illustrative netlist of FIG. 9D. Specifically, the Spectre language requires both the "3" and the "|" characters to be escaped, whereas the Verilog-AMS language requires only the "3" character to be escaped, and the entire now-escaped identifier to be appended with a trailing space.

In addition, the analog netlister 506 creates a second netlister mapping, which comprises the analog netlister mapping shown in FIG. 9E, a portion of which is represented in Table 4.

TABLE 4

| Type of item | scope | First identifier used in schematic | Third identifier used in Spectre |
|---|---|---|---|
| netMap | top | 3m_rg_1M|d | \3m_rg_1M\|d |

Note that net named with the first identifier "3m_rg__1M|d" in the schematic cell view of FIG. 9A has spawned two additional identifiers for the same net: a second identifier, "\3m_rg__1M|d" in the VAMS language in Table 3; and a third identifier, "\3m_rg__1M\|d" in the Spectre language in Table 4.

Next, assume for example, that the process module 624 of the assembler portion 606 comes upon digital netlist module of FIG. 9B, and that decision module 612 uses the scope identifier "top" in the digital netlist of FIG. 9B and the scope identifier "top" in the analog netlist of FIG. 9D to determine that both of these modules were created from instance cells contained within the schematic cell view of FIG. 9A identified as "top". Then, decision module 616 refers to the respective mapping files of FIG. 9C and FIG. 9E to identify the name clash between the second identifier "\3m_rg__1M|d" and the third identifier, "\3m_rg__1M\|d" (See, Tables 3 and 4). Process module 620 merges mapping information from analog mapping of FIG. 9C into the combined mapping of FIG. 9G, and in doing so, adopts the mapping of the digital mapping of FIG. 9C so as to resolve the identifier clash in favor of the identifier selected by the digital netlister 504.

A portion of the combined mapping 522 produced by assembler 520 is represented in Table 5.

TABLE 5

| Type of item | scope | First identifier used in schematic | Second identifier used in Combined Netlist |
|---|---|---|---|
| netMap | top | 3m_rg_1M|d | \3m_rg_1M|d |

Process module 621 converts the analog netlist subcircuit of FIG. 9C to a digital netlist module representation within the combined netlist of FIG. 9F. It will be noted that the analog component M1 is represented as connected to the net named with the third identifier, "\3m_rg__1M\|d" in the Spectre language in the analog netlist of FIG. 9D, but that same analog component M1 is represented connected to the same net, which named with the second identifier, "\3m_rg__1M|d" in the VAMS language in the combined netlist of FIG. 9F. Note that the instances within the digital netlist module of FIG. 9F are left unchanged from their form in FIG. 9B as produced by the digital netlister 504.

It will be appreciated that in the combined netlist of FIG. 9F, a single name, the third identifier, "\3m_rg__1M|d" is used to represent the shared net. Moreover, the combined mapping of FIG. 9G unambiguously maps back to the net identified with the first identifier "3m_rg__1M|d" in the original schematic cell view of FIG. 9A.

The digital mapping file of FIG. 9C also differs from the analog mapping file of FIG. 9E in the mapping of the "gnd!" in the schematic design namespace. The digital map file maps "gnd!" in the schematic design to "cds_globals.\gnd!" in the VAMS digital map file. Whereas, the analog map file maps "gnd!" in the schematic design to '0' in the Spectre map file. The final mapping file of FIG. 9G maps "gnd!" in the schematic design to "cds_globals.\gnd!" consistent with VAMS language rules. The instance statement beginning "d25 M1 . . . " within the final netlist file of FIG. 9F therefore references "cds_globals.\gnd!" (legal in the Verilog-AMS namespace) in lieu of the corresponding node "0" (legal in the Spectre namespace) which was present in the analog netlist of FIG. 9D. This particular change is required because in the analog netlist of FIG. 9D, node "0" is treated as a global node, but since the Verilog-AMS language does not support the concept of global nodes, they are replaced with unique hierarchical nodes such as "cds_globals.\gnd!" where "cds_globals" represents an instance name, and node "\gnd!" is contained within that instance. This example illustrates another difficulty introduced by the differing language syntax and semantics of Verilog-AMS and Spectre respectively, which has to be catered to by the netlist assembler 520. Corresponding/analogous comments can be made about the treatment of global node "vdd!" in the analog netlist of FIG. 9D and the Verilog-AMS equivalent "cds_globals.\vdd!" in the final digital netlist of FIG. 9F.

Also, the digital map file maps "vdd!" in the schematic design to "cds_globals.\vdd!" in the VAMS digital map file. However, the analog map file has no mapping of "vdd!". The combined mapping file of FIG. 9G maps "vdd!" in the schematic design to "cds_globals.\vdd!" consistent with VAMS language rules. This represents yet another special case, in which node "0" is represented within the Spectre namespace as a global reference node (all node voltages are calculated by the simulator with respect to the reference node). The instance statement beginning "M0 . . . " in the analog netlist of FIG. 9D therefore replaces references to original schematic namespace node "gnd!" with the analog netlist global reference node "0" as a special case, the netlist assembler 520 therefore also has to take this into account when translating from the analog netlist of FIG. 9D to the final netlist of FIG. 9F, replacing occurrences of the analog netlist global reference node "0" with "cds_globals.\gnd!", and updating the mapping accordingly such that the final map of FIG. 9G has no reference to the analog global reference node "0".

Table 6 sets forth conversions from certain Spectre code of FIG. 9D to corresponding VAMS code in the combined netlist of FIG. 9F.

TABLE 6

| Spectre netlist code segment | Combined netlist code segment |
| --- | --- |
| M1 (\3m_rg_1M\ld in 0 0) d25N | d25N M1 (\3m_rg_1M\ld , in, cds_globals.\gnd! , cds_globals.\gnd! ); |
| V1 (vdd! 0) vsource dc=Vsup type=dc | V1 (cds_globals.\vdd! , cds_globals.\gnd! ); |

Hardware Embodiment

Figure 10:
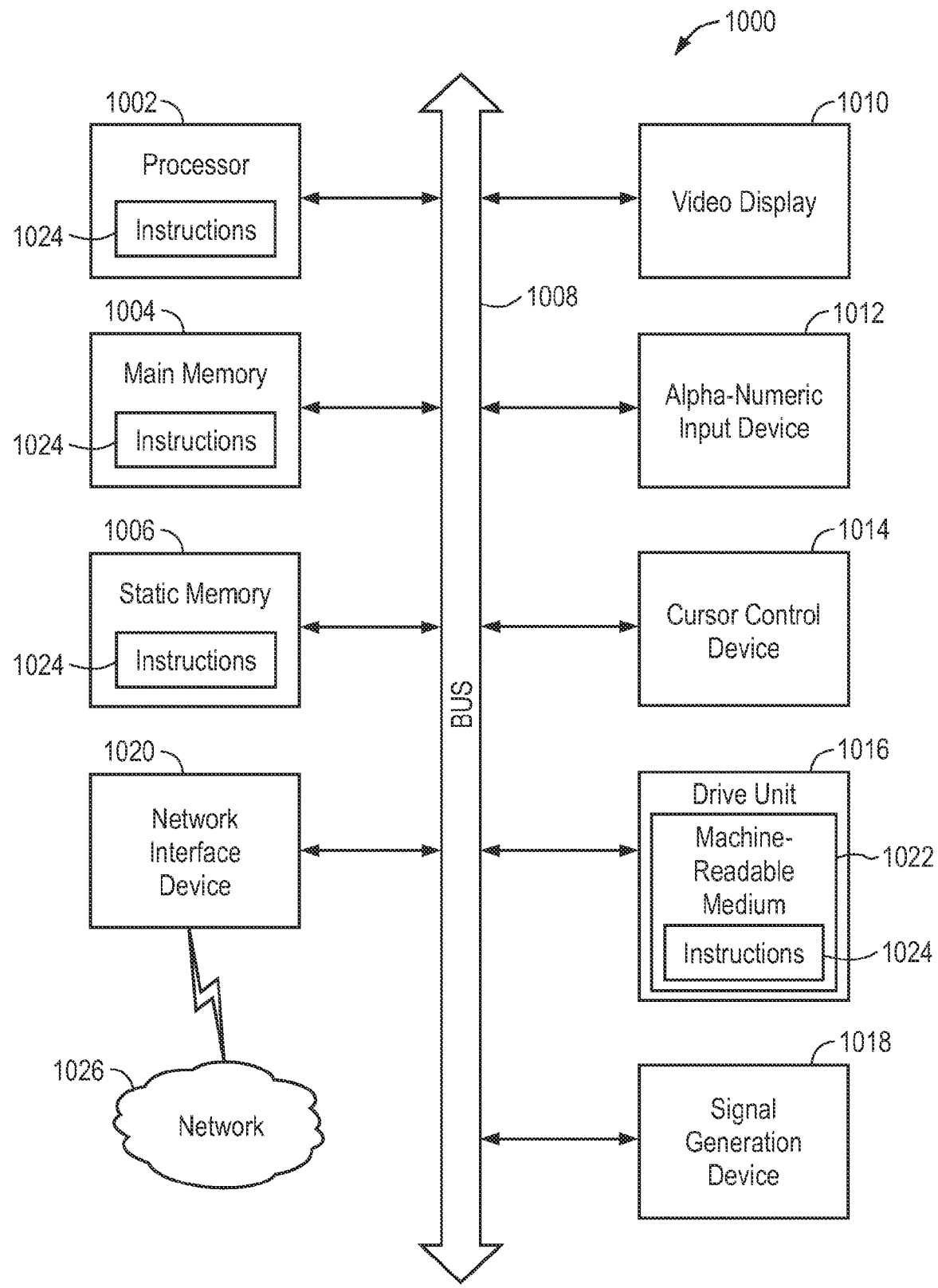
FIG. 10 is a block diagram of a computer processing system within which a set of instructions, for causing the computer to perform any one or more of the methodologies discussed herein, may be executed.

FIG. 10 is a block diagram of a computer processing system within which a set of instructions, for causing the computer to perform any one or more of the methodologies discussed herein, may be executed. In some embodiments, the computer operates as a standalone device or may be connected (e.g., networked) to other computers. In a networked deployment, the computer may operate in the capacity of a server or a client computer in server-client network environment, or as a peer computer in a peer-to-peer (or distributed) network environment. In a networked deployment, the computer may operate in the capacity of a server or a client computer in a server-client network environment, or as a peer computer in a peer-to-peer (or distributed) network environment.

Embodiments may also, for example, be deployed by Software-as-a-Service (SaaS), Application Service Provider (ASP), or utility computing providers, in addition to being sold or licensed via traditional channels. The computer may be a server computer, a personal computer (PC), a tablet PC, a set-top box (STB), a Personal Digital Assistant (PDA), cellular telephone, or any processing device capable of executing a set of instructions (sequential or otherwise) that specify actions to be taken by that device. Further, while only a single computer is illustrated, the term "computer" shall also be taken to include any collection of computers that individually or jointly execute a set (or multiple sets) of instructions to perform any one or more of the methodologies discussed herein.

The example computer processing system 1000 includes processor 1122 (e.g., a central processing unit (CPU), a graphics processing unit (GPU) or both), non-transitory main memory storage 1004 and non-transitory static memory storage 1006, which communicate with each other via bus 1008. The processing system 1000 may further include video display unit 1020 (e.g., a plasma display, a liquid crystal display (LCD) or a cathode ray tube (CRT)). The processing system 1000 also includes alphanumeric input device 1022 (e.g., a keyboard), a user interface (UI) navigation device 1014 (e.g., a mouse, touch screen, or the like), a disk drive unit 1116, a signal generation device 10118 (e.g., a speaker), and a network interface device 1020.

The disk drive unit 1026 includes non-transitory computer-readable storage device 1122 on which is stored one or more sets of instructions and data structures (e.g., software 1024) embodying or utilized by any one or more of the methodologies or functions described herein. The software 1024 may also reside, completely or at least partially, within a computer readable storage device such as the non-transitory main memory storage device 1004 and/or within the processor 1022 during execution thereof by the processing system 1100, the non-transitory main memory storage device 1004 and the processor 1022 also constituting computer-readable, tangible media.

The software 1024 may further be transmitted or received over network 1126 via a network interface device 1020 utilizing any one of a number of well-known transfer protocols (e.g., HTTP).

While the computer-readable storage device 1022 is shown in an example embodiment to be a single medium, the term "computer-readable storage device" should be taken to include a single medium or multiple media (e.g., a centralized or distributed database, and/or associated caches and servers) that store the one or more sets of instructions. The term "computer-readable storage device" shall also be taken to include any medium that is capable of storing, encoding or carrying a set of instructions for execution by the computer and that cause the computer to perform any one or more of the methodologies of the present application, or that is capable of storing, encoding or carrying data structures utilized by or associated with such a set of instructions. The term "computer-readable storage device" shall accordingly be taken to include, but not be limited to, solid-state memories, and optical and magnetic media.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements fall within the scope of the invention(s).

Therefore, the foregoing description and drawings of embodiments are merely illustrative of the principles of the invention. Various modifications can be made to the embodiments by those skilled in the art without departing from the spirit and scope of the invention, which is defined in the appended claims.

The invention claimed is:

1. A method to convert an analog mixed-signal schematic design in non-transitory storage to a digital netlist in non-transitory storage, the method comprising:
    converting digital blocks within the schematic design to corresponding digital netlist modules in non-transitory storage;
    converting analog blocks within the schematic design to corresponding analog netlist modules in non-transitory storage;
    determining whether respective analog netlist modules correspond to analog blocks within the schematic design that are contained within a view within the schematic design that also contains a respective digital block;
    in response to determining that a respective analog netlist module corresponds to a respective analog block within the schematic design that is contained within a respective view within the schematic design that also contains a respective digital block, determining whether the respective analog block shares a respective component within the schematic design with the respective digital block;
    in response to determining that the respective analog block shares a respective component within the schematic design with the respective digital block, selecting an identifier for the component within the respective analog netlist module that matches an identifier for the same component within a respective digital netlist module that corresponds to the respective digital block within the view;
    converting the analog netlist modules to corresponding digital netlist modules in non-transitory storage; and
    producing a mapping file in non-transitory storage that includes a mapping between the identifiers used in one or more digital netlist files and identifiers used to identify corresponding components in the schematic design.

2. The method of claim 1 wherein producing a mapping file in non-transitory storage includes:
    producing a first mapping file in non-transitory storage between identifiers used for components within the digital netlist modules and corresponding identifiers used for the same corresponding components in the schematic design;
    producing a second mapping file in non-transitory storage between identifiers used for components within the analog netlist modules and corresponding identifiers used for the same corresponding components in the schematic design;
    producing a third mapping file in non-transitory storage that combines the first mapping and the second mapping and that substitutes identifiers in the first mapping for corresponding identifiers in the second mapping that correspond to the same corresponding components in the schematic design.

3. The method of claim 1, wherein a digital language used by the digital netlist modules comprises Verilog-AMS.

4. The method of claim 1, wherein an analog language used by the analog netlist modules comprises at least one of SPICE and Spectre.

5. The method of claim 1,
    wherein converting digital blocks includes using a digital netlister to convert the digital blocks; and
    wherein converting analog blocks includes using an analog netlister to convert the analog blocks.

* * * * *